United States Patent
Sreenivasula Reddy et al.

(10) Patent No.: US 10,381,054 B1
(45) Date of Patent: Aug. 13, 2019

(54) COMMON BOOSTED ASSIST

(71) Applicant: GLOBALFOUNDRIES INC., Grand Cayman (KY)

(72) Inventors: Dhani Reddy Sreenivasula Reddy, Bengaluru (IN); Vinay Bhat Soori, Kumta (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/906,588

(22) Filed: Feb. 27, 2018

(51) Int. Cl.
| | | |
|---|---|---|
| *G11C 7/00* | (2006.01) | |
| *G11C 7/12* | (2006.01) | |
| *G11C 5/14* | (2006.01) | |
| *G11C 7/06* | (2006.01) | |
| *G11C 11/4091* | (2006.01) | |
| *G11C 11/419* | (2006.01) | |

(52) U.S. Cl.
CPC .............. *G11C 7/12* (2013.01); *G11C 5/147* (2013.01); *G11C 7/067* (2013.01); *G11C 11/4091* (2013.01); *G11C 11/419* (2013.01)

(58) Field of Classification Search
CPC ....................................................... G11C 7/12
USPC ................................................... 365/198.14
See application file for complete search history.

(56) References Cited

U.S. PATENT DOCUMENTS

| | | | |
|---|---|---|---|
| 5,659,260 A | 8/1997 | Kajimoto et al. | |
| 5,917,767 A | 6/1999 | Ohta | |
| 6,392,951 B2 | 5/2002 | Fujima et al. | |
| 7,679,948 B2 | 3/2010 | Park et al. | |
| 9,824,749 B1* | 11/2017 | Nautiyal | G11C 11/419 |
| 2010/0309736 A1* | 12/2010 | Russell | G11C 11/413 |
| | | | 365/189.011 |
| 2012/0307574 A1 | 12/2012 | Cheng et al. | |
| 2014/0160871 A1* | 6/2014 | Zimmer | G11C 7/12 |
| | | | 365/189.16 |

OTHER PUBLICATIONS

Quang Kien Trinh et al, "Novel Boosted-Voltage Sensing Scheme for Variation-Resilient STT-MRAM Read", IEEE Transactions on Circuits and Systems I: Regular Papers, vol. 63, No. 10, Oct. 2016, 9 pages.

\* cited by examiner

*Primary Examiner* — Hoai V Ho
(74) *Attorney, Agent, or Firm* — Michael LeStrange; Andrew M. Calderon; Roberts Mlotkowski Safran Cole & Calderon, P.C.

(57) ABSTRACT

The present disclosure relates to a structure which includes an assist circuit which is configured to add a boost voltage using a common boost logic device for both a read logic circuit and a write logic circuit of the assist circuit.

20 Claims, 4 Drawing Sheets

COMMON BOOSTED ASSIST

FIELD OF THE INVENTION

The present disclosure relates to a common boosted assist, and more particularly, to a circuit and a method for a common boosted assist for write and read operations of a memory device.

BACKGROUND

Memory devices are employed as internal storage areas in a computer or other electronic equipment. One specific type of memory used to store data in a computer is random access memory (RAM). RAM is typically used as main memory in a computer environment, and is generally volatile in that once power is turned off, all data stored in the RAM is lost.

A static random access memory (SRAM) is one example of RAM. An SRAM has the advantage of holding data without a need for refreshing. A typical SRAM device includes an array of individual SRAM cells. Each SRAM cell is capable of storing a binary voltage value that represents a logical data bit (e.g., "0" or "1"). One existing configuration for a SRAM cell includes a pair of cross-coupled devices such as inverters. The inverters act as a latch that stores the data bit therein, so long as power is supplied to the memory array.

A dynamic random access memory (DRAM) is another example of a RAM. A DRAM has a memory storage array and circuitry for writing data to the storage array and reading the stored data. In a typical DRAM, data is written to and read from memory cells of the storage array by storing a high voltage or a low voltage on a storage capacitor of each memory cell. The high voltage typically represents a stored "1" and the low voltage typically represents a stored "0", in a binary data scheme. DRAMs are volatile memory, such that data remains stored on the storage capacitors therein so long as the DRAM remains powered on and is refreshed at required intervals.

In both SRAM and DRAM, for low voltage values (i.e., approximately 0.4 volts) and low currents, there is an issue with resolving a known state (i.e., to resolve the state to a "1" or a "0"). Because of this issue, there is a need to provide more current in order to improve memory yield.

SUMMARY

In an aspect of the disclosure, a structure includes an assist circuit which is configured to add a boost voltage using a common boost logic device for both a read logic circuit and a write logic circuit of the assist circuit.

In another aspect of the disclosure, a circuit includes a read logic circuit configured to sense a differential voltage through a sense amplifier during a read operation, a write logic circuit which is configured to write a data value through at least one bitline during a write operation, and a common boost logic device configured to add a boost voltage to one of the read logic circuits and the write logic circuit.

In another aspect of the disclosure, a method includes adding a boost voltage to a read logic circuit of an assist circuit using a common boost logic device during a read operation, adding the boost voltage to a write logic circuit of the assist circuit using the common boost logic device during a write operation, and preventing data from being propagated through the write logic circuit during the read operation.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to a common boosted assist, and more particularly, to a circuit and a method for a common boosted assist for write and read operations of a memory device. In more specific embodiments, the present disclosure provides a common boosted assist for both write and read operations, which allows for the same boost logic circuitry to improve read yield at low voltages as the write yield at low voltages. For example, the present disclosure allows for a negative bitline boosted assist for both read and write operations using a common boost logic circuitry.

In conventional circuitry, negative bitline boosted assist occurs for a write operation. In the conventional circuitry, boost fins are not used during a read operation. In the present disclosure, though, without adding any extra boost fins the same boost logic can be used during a read operation to improve read yield at lower voltages. In the present disclosure, the boost logic circuitry adds a NMOS transistor to a stack of sense amplifier bias transistors. The NMOS transistor is a same transistor as a transistor that holds virtual ground during a write operation. In embodiments, the NMOS transistor is gated with a complement boost signal BOOSTN, where the complement boost signal BOOSTN is generated from a NOR gate which takes a write selection signal WSELP and a sense amplifier enable signal SET.

In the present disclosure, read and write assists are physically isolated with a common complement boost signal BOOSTN. In other words, a read operation in the common boost assist circuitry will not disturb the write operation and vice-versa. Further, in the present disclosure, when using the common boost assist circuitry, there is a performance improvement in the sense amplifier enable signal SET to output path at lower voltages (i.e., faster access time because of steep slope in the data line complement signal DLC and the data line true signal DLT of the common boosted assist circuitry). The common boost assist circuitry are functional at very low voltage corners and are able to be integrated with multi-bank designs. Lastly, the common boosted assist circuitry can be used when read currents are small (i.e., low voltage during a read operation).

Figure 1:
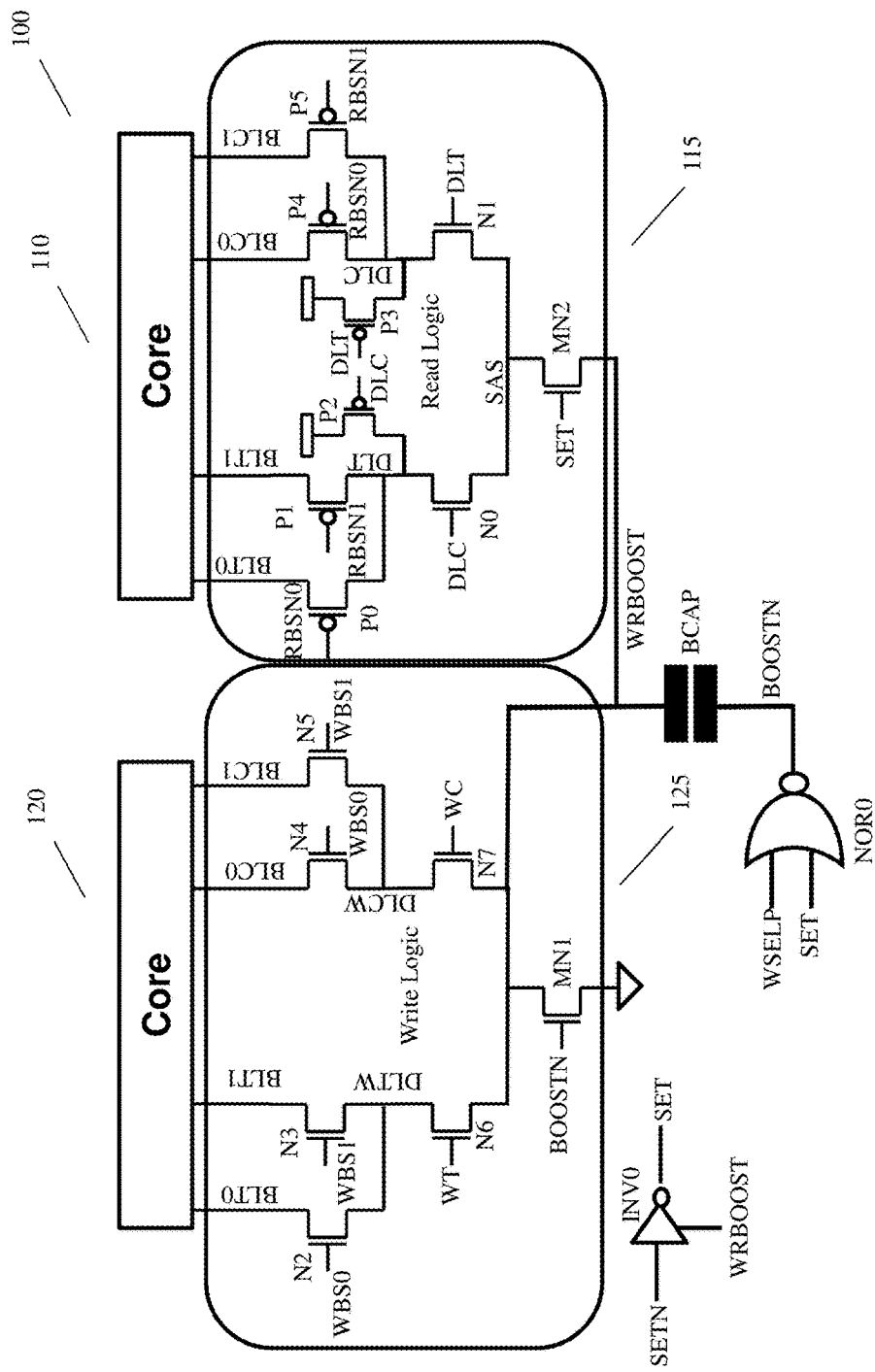
FIG. 1 shows a common boosted assist for write and read operations in accordance with aspects of the present disclosure.

FIG. 1 shows a common boosted assist for write and read operations in accordance with aspects of the present disclosure. In FIG. 1, the common boosted assist circuitry 100 includes a read logic circuitry 110 and a write logic circuitry 120. The read logic circuitry 110 includes a core connected to a read logic 115 through a first true bitline BLT0, a first complement bitline BLC0, a second true bitline BLT1, and a second complement bitline BLC1. The write logic circuitry 120 also includes a core connected to a write logic 125 through a first true bitline BLT0, a first complement bitline BLC0, a second true bitline BLT1, and a second complement bitline BLC1. In embodiments, the core of the read logic circuitry 110 can be the same core as the core of the write logic circuitry 120.

Referring still to FIG. 1, in the read logic 115, a PMOS transistor P0 has a source connected to the first true bitline BLT0, a gate connected to a first read bitswitch signal RBSN0, and a drain connected to a data true signal DLT. Further, in the read logic 115, a PMOS transistor P1 has a source connected to a second true bitline BLT1, a gate connected to a second read bitswitch signal RBSN1, and a drain connected to the data true signal DLT. In addition, a PMOS transistor P2 has a source connected to an output, a gate connected to a data complement signal DLC, and a drain connected to the data true signal DLT. Further, PMOS transistor P3 has a source connected to the output, a gate connected to the data true signal DLT, and a drain connected to the data complement signal DLC.

Still referring to the read logic 115, a PMOS transistor P4 has a source connected to the first complement bitline BLC0, a gate connected to the first read bitswitch signal RBSN0, and a drain connected to the data complement signal DLC. A PMOS transistor P5 has a source connected to the second complement bitline BLC1, a gate connected to the second read bitswitch signal RBSN1, and a drain connected to the data complement signal DLC. In the read logic 115, a NMOS transistor N0 has a drain connected to the data true signal DLT, a gate connected to the data complement signal DLC, and a source connected to a sense amplifier signal SAS. A NMOS transistor N1 has a drain connected to the data complement signal DLC, a gate connected to the data true signal DLT, and a source connected to the sense amplifier signal SAS. Lastly, in the read logic 115, a NMOS transistor MN2 has a drain connected to the sense amplifier signal SAS, a gate connected to a sense amplifier enable signal SET, and a drain connected to a boost signal WRBOOST.

Still referring to FIG. 1, in the write logic 125, a NMOS transistor N2 has a drain connected to the first true bitline BLT0, a gate connected to a first write bitswitch signal WBS0, and a source connected to a write data true signal DLTW. A NMOS transistor N3 has a drain connected to the second true bitline BLT1, a gate connected to a second write bitswitch signal WBS1, and a source connected to the write data true signal DLTW. In addition, in the write logic 125, a NMOS transistor N4 has a drain connected to the second complement bitline BLC0, a gate connected to the first write bitswitch signal WBS0, and a source connected to the write data complement signal DLCW. A NMOS transistor N5 has a drain connected to the second complement bitline BLC1, a gate connected to the second write bitswitch signal WBS1, and a source connected to the write data complement signal DLCW.

Still referring to the write logic 125, a NMOS transistor N6 has a drain connected to the write data true signal DLTW, a gate connected to a first write driver WT, and a source connected to a boost signal WRBOOST. A NMOS transistor N7 has a drain connected to the write data complement signal DLCW, a gate connected to a second write driver WC, and a source connected to the boost signal WRBOOST. Lastly, in the write logic 125, a NMOS transistor MN1 has a drain connected to the boost signal WRBOOST, a gate connected to the complement boost signal BOOSTN, and a source connected to ground.

In FIG. 1, the common boosted assist circuitry 100 also includes a boosted capacitor BCAP, a NOR gate NOR0, and an inverter INV0. The write selection signal WSELP and the sense amplifier enable signal SET inputs to the NOR gate NOR0 and outputs the complement boost signal BOOSTN. The complement sense amplifier enable signal SETN is input to the inverter INV0 and outputs the sense amplifier enable signal SET.

In FIG. 1, the assist circuit (i.e., the common boosted assist circuitry 100) is configured to add a boost voltage (i.e., a voltage of a boost signal WRBOOST) using a common boost logic device (i.e., NMOS transistor MN1) for both a read logic circuit (i.e., read logic 115) and a write logic circuit (i.e., write logic 125). The assist circuit is further configured to add the boost voltage to the read logic circuit during a read operation using the common boost logic device and stop the boost voltage from being added to the write logic circuit during the read operation using the common boost logic device. In FIG. 1, the read logic, the sense amplifier (i.e., PMOS transistors P2, P3 and NMOS transistors N0, N1, MN2) receives the added boost voltage during the read operation.

In FIG. 1, the assist circuit 100 is also configured to add the boost voltage to the write logic circuit during a write operation using the common boost logic device. The assist circuit 100 is also configured to stop the boost voltage from being added to the read logic circuit 115 during the write operation using the common boost logic device (i.e., NMOS transistor MN1). The write logic circuit 125 includes at least one bitline which receives the added boost voltage during the write operation. The common boost logic device is at least one NMOS transistor (i.e., NMOS transistor MN1) configured to control whether the boost voltage is added to the read logic circuit or the write logic circuit. The assist circuit can also be included in at least one of a SRAM, a DRAM, and a single ended sense amplifier design.

In a read operation of FIG. 1, the sense amplifier enable signal SET is changed from a "0" value to a "1" value. In embodiments, the sense amplifier enable signal SET can be of a narrow pulse width and the complement sense amplifier enable signal SETN is one gate earlier than the sense amplifier enable signal SET. The write selection signal WSELP is set to a "0" value. An output of the NOR gate NOR0 (i.e., the complement boost signal BOOSTN) goes from a "1" value to a "0" value as a result of the values of the sense amplifier enable signal SET and the write selection signal WSELP. Based on the complement boost signal BOOSTN going to a "0" value, the boost signal WRBOOST goes from a "0" value to a negative voltage value. Further, in the write logic 125 during the read operation, the first write bit switch signal WBS0 is "0" and the second write switch signal WBS1 is "0", which turns off NMOS transistors N2-N5. During the read operation, a first write driver WT is "0" and the second write driver WC is "1", which turns off the NMOS transistor N6 and turns on the NMOS transistor N7. Further, as the complement boost signal BOOSTN has a "0" value, the NMOS transistor MN1 turns off.

In the read operation of FIG. 1, the first read bitswitch signal RBSN0 has a "1" value and the second read bitswitch signal RBSN1 goes from a "1" value to a "0" value. Therefore, the PMOS transistors P0 and P4 are turned off while the PMOS transistors P1 and P5 are turned on. Further, the data complement signal DLC goes from a "1" value to a "0" value (if cell is storing 0 on the side of DLC), which turns off NMOS transistor N0. The data true signal DLT has a "1" value (if cell is storing 1 on the side of DLT).

The NMOS transistor MN2 gate goes from a "0" value to a "1" value, which allows for the boost signal WRBOOST and the sense amplifier signal SAS to have a same value (i.e., a negative voltage value). Therefore, in the read operation of FIG. 1, a negative voltage value is transferred to the sense amplifier signal SAS through the NMOS transistor MN2.

In summary, in the read operation of FIG. 1, the write selection signal WSELP is a "0" value for the entire read operation. Further, during the read operation, the sense amplifier enable signal SET starts at a "0" value and then goes to a "1" value once the bitlines develop a sufficient differential. Once the sense amplifier enable signal SET is a "1" value (i.e., is fired), the complement boost signal BOOSTN goes to a "0" value and will boost the boost signal WRBOOST to a negative voltage value. This negative voltage value of the boost signal WRBOOST is transferred to the sense amplifier signal SAS through the NMOS transistor MN2.

In a write operation of FIG. 1, a sense amplifier enable signal SET has a "0" value. The write selection signal WSELP is changed from a "0" value to a "1" value. An output of the NOR gate NOR0 (i.e., the complement boost signal BOOSTN) goes from a "1" value to a "0" value as a result of the values of the sense amplifier enable signal SET and the write selection signal WSELP. Based on the complement boost signal BOOSTN going to a "0" value, the boost signal WRBOOST goes from a "0" value to a negative voltage value. Further, in the write logic 125 during the write operation, the first read bitswitch signal RBSN0 is a "1" value, the second read bitswitch signal RBSN1 is a "1" value, the data complement signal DLC is "1", and the data true signal DLT is "0". Further, as the sense amplifier enable signal SET has a "0" value, the NMOS transistor MN2 turns off which prevents the boost signal WRBOOST from being transferred to the sense amplifier signal SAS.

In addition, in the write operation of FIG. 1, the first write bitswitch signal WBS0 has a "0" value and the second write bitswitch signal WBS1 goes from a "0" value to a "1" value. Therefore, the NMOS transistors N3 and N5 are turned on while the NMOS transistors N2 and N4 are turned off. Further, the write data complement signal DLCW is at a "1" value (as WC is at "0" value) and the write true complement signal DLTW goes from a "1" value to a "0" value (as WT is switched from "0" to "1" value). The first write driver WT goes from a "0" value to a "1" value and the second write driver WC has a "0" value. Lastly, the complement boost signal BOOSTN goes from a "1" value to a "0" value. Therefore, in the write operation of FIG. 1, a negative voltage value on the boost signal WRBOOST is transferred to the bitlines (e.g., BLT0 and BLT1) of the write logic 125.

In summary, in the write operation of FIG. 1, the sense amplifier enable signal SET is a "0" value for the entire write operation. Further, during the write operation, the write selection signal WSELP starts at a "0" value and then goes to a "1" value once the bitlines are pulled to ground so that the bitlines can be boosted. Once the write selection signal WSELP is a "1" value, the complement boost signal BOOSTN goes to a "0" value and the sense amplifier bias path (i.e., the read logic 115) will be turned off. The complement boost signal BOOSTN going to a "0" value will create a negative voltage value of the boost signal WRBOOST. The negative voltage value of the boost signal WRBOOST is transferred to the bitlines (e.g., BLT0 and BLT1) of the write logic 125.

Figure 2:
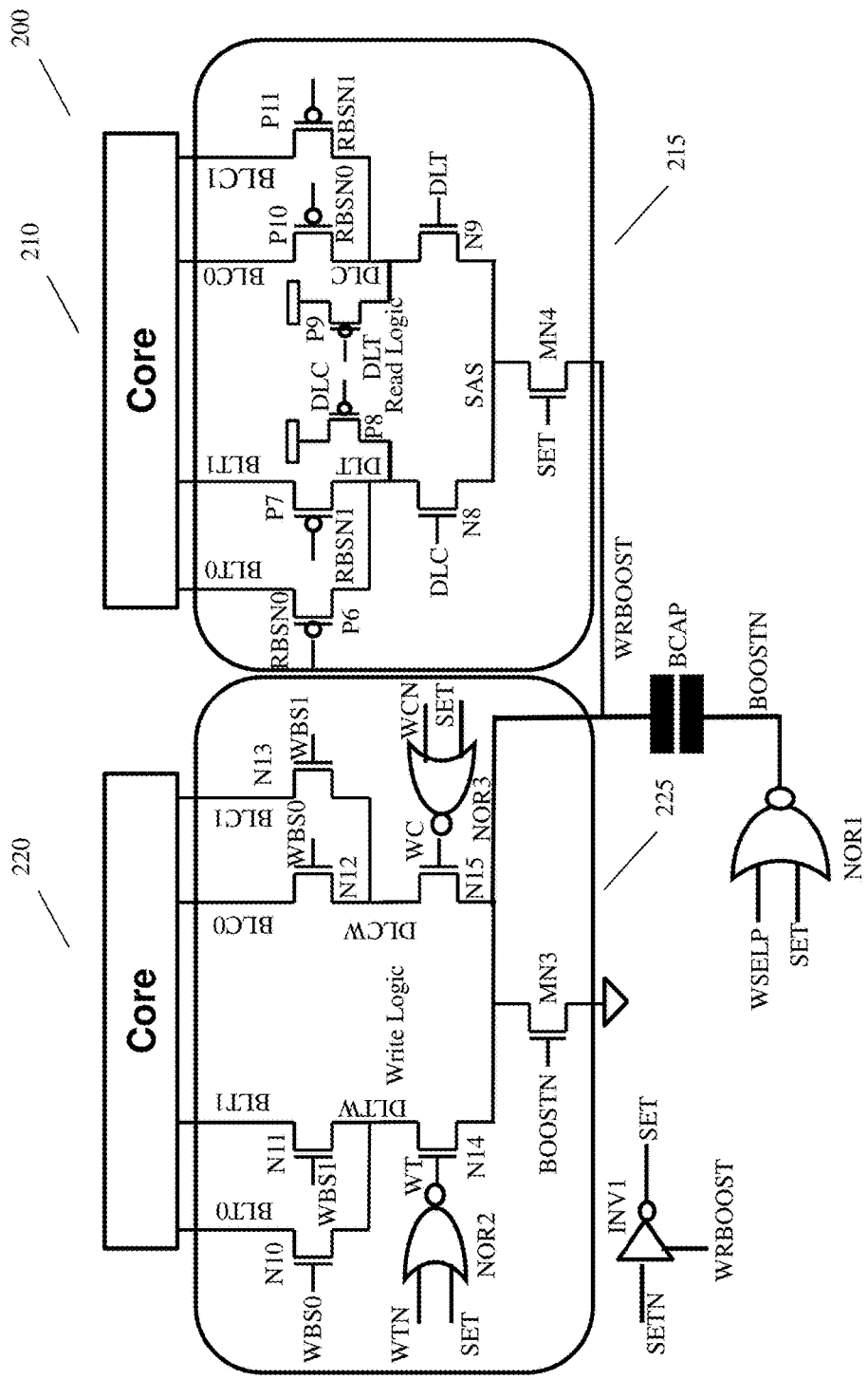
FIG. 2 shows another common boosted assist for write and read operations in accordance with aspects of the present disclosure.

FIG. 2 shows another common boosted assist for write and read operations in accordance with aspects of the present disclosure. Except for the addition of the NOR gates NOR2 and NOR3 in FIG. 2, the common boosted assist circuitry 200 in FIG. 2 is similar to the common boosted assist circuitry 100 in FIG. 1. The addition of the NOR gates NOR2 and NOR3 in the common boosted assist circuitry 200 will prevent either of the write drivers turning on to avoid charge leak from the boost during the read operation. In other words, the NOR gates NOR2 and NOR3 in the write logic 225 will force the first write driver WT and the second writer driver WC to be at a low state during the read operation to prevent either of the write drivers turning on to avoid charge leak from the boost of the write logic 225. Further, the write logic circuit (i.e., write logic 125) is configured to prevent either of the write drivers turning on to avoid charge leak from the boost data from being propagated through the write logic circuit during a read operation.

In FIG. 2, the common boosted assist circuitry 200 includes a read logic circuitry 210 and a write logic circuitry 220. The read logic circuitry 210 includes a core connected to a read logic 215 through a first true bitline BLT0, a first complement bitline BLC0, a second true bitline BLT1, and a second complement bitline BLC1. The write logic circuitry 220 also includes a core connected to a write logic 225 through a first true bitline BLT0, a first complement bitline BLC0, a second true bitline BLT1, and a second complement bitline BLC1. In embodiments, the core of the read logic circuitry 210 can be the same core as the core of the write logic circuitry 220.

Referring still to FIG. 2, in the read logic 215, a PMOS transistor P6 has a source connected to the first true bitline BLT0, a gate connected to a first read bitswitch signal RBSN0, and a drain connected to a data true signal DLT. Further, in the read logic 215, a PMOS transistor P7 has a source connected to a second true bitline BLT1, a gate connected to a second read bitswitch signal RBSN1, and a drain connected to the data true signal DLT. In addition, a PMOS transistor P8 has a source connected to an output, a gate connected to a data complement signal DLC, and a drain connected to the data true signal DLT. Further, PMOS transistor P9 has a source connected to the output, a gate connected to the data true signal DLT, and a drain connected to the data complement signal DLC.

Still referring to the read logic 215, a PMOS transistor P10 has a source connected to the first complement bitline BLC0, a gate connected to the first read bitswitch signal RBSN0, and a drain connected to the data complement signal DLC. A PMOS transistor P11 has a source connected to the second complement bitline BLC1, a gate connected to the second read bitswitch signal RBSN1, and a drain connected to the data complement signal DLC. In the read logic 215, a NMOS transistor N8 has a drain connected to the data true signal DLT, a gate connected to the data complement signal DLC, and a source connected to a sense amplifier signal SAS. A NMOS transistor N9 has a drain connected to the data complement signal DLC, a gate connected to the data true signal DLT, and a source connected to the sense amplifier signal SAS. Lastly, in the read logic 215, a NMOS transistor MN4 has a drain connected to the sense amplifier signal SAS, a gate connected to a sense amplifier enable signal SET, and a drain connected to a boost signal WRBOOST.

Still referring to FIG. 2, in the write logic 225, a NMOS transistor N10 has a drain connected to the first true bitline BLT0, a gate connected to a first write bitswitch signal WBS0, and a source connected to a write data true signal DLTW. A NMOS transistor N11 has a drain connected to the second true bitline BLT1, a gate connected to a second write bitswitch signal WBS1, and a source connected to the write data true signal DLTW. In addition, in the write logic 225, a NMOS transistor N12 has a drain connected to the second complement bitline BLC0, a gate connected to the first write bitswitch signal WBS0, and a source connected to the write data complement signal DLCW. A NMOS transistor N13 has a drain connected to the second complement bitline BLC1, a gate connected to the second write bitswitch signal WBS1, and a source connected to the write data complement signal DLCW.

Still referring to the write logic 225, a NMOS transistor N14 has a drain connected to the write data true signal DLTW, a gate connected to a first write driver WT, and a source connected to a boost signal WRBOOST. A NMOS transistor N15 has a drain connected to the write data complement signal DLCW, a gate connected to a second write driver WC, and a source connected to the boost signal WRBOOST. A NOR gate NOR2 takes inputs of a complement first write driver WTN and a sense amplifier enable signal SET and outputs the first write driver WT. A NOR gate NOR3 takes inputs of a complement second write driver WCN and a sense amplifier enable signal SET and outputs the second write driver WC. Lastly, in the write logic 225, a NMOS transistor MN3 has a drain connected to the boost signal WRBOOST, a gate connected to the complement boost signal BOOSTN, and a source connected to ground.

In FIG. 2, the common boosted assist circuitry 200 also includes a boosted capacitor BCAP, a NOR gate NOR1, and an inverter INV1. The write selection signal WSELP and the sense amplifier enable signal SET inputs to the NOR gate NOR1 and outputs the complement boost signal BOOSTN. The complement sense amplifier enable signal SETN is input to the inverter INV1 and outputs the sense amplifier enable signal SET.

The read operation of the common boosted assist circuitry 200 in FIG. 2 is similar to FIG. 1. In particular, the write selection signal WSELP is a "0" value for the entire read operation. Further, during the read operation, the sense amplifier enable signal SET starts at a "0" value and then goes to a "1" value once the bitlines develop a sufficient differential. In embodiments, the sense amplifier enable signal SET can be of a narrow pulse width and the complement sense amplifier enable signal SETN is one gate earlier than the sense amplifier enable signal SET. Once the sense amplifier enable signal SET is a "1" value (i.e., is fired), the complement boost signal BOOSTN goes to a "0" value and will boost the boost signal WRBOOST to a negative voltage value. This negative voltage value of the boost signal WRBOOST is transferred to the sense amplifier signal SAS through the NMOS transistor MN4. Further, the NOR gates NOR2 and NOR3 prevent data propagation through the write logic 225 during the read operation.

The write operation of the common boosted assist circuitry 200 in FIG. 2 is similar to FIG. 1. In particular, the sense amplifier enable signal SET is a "0" value for the entire write operation. Further, during the write operation, the write selection signal WSELP starts at a "0" value and then goes to a "1" value once the bitlines are pulled to ground so that the bitlines can be boosted. Once the write selection signal WSELP is a "1" value, the complement boost signal BOOSTN goes to a "0" value and the sense amplifier bias path (i.e., the read logic 215) will be turned off. The complement boost signal BOOSTN going to a "0" value will create a negative voltage value of the boost signal WRBOOST. The negative voltage value of the boost signal WRBOOST is transferred to the bitlines (e.g., BLT0 and BLT1) of the write logic 225.

In FIG. 2, a boost voltage can be added to a read logic circuit 215 of an assist circuit 200 using a common boost logic device (i.e., NMOS transistor MN3) during a read operation, adding the boost voltage to a write logic circuit 225 of the assist circuit 200 using the common boost logic device during a write operation, and prevent data from being propagated through the write logic circuit during the read operation. The common boosted logic device (i.e., NMOS transistor MN3) is at least one NMOS transistor and the data is prevented from being propagated through the write logic circuit using at least one NOR gate in the write logic circuit.

Figure 3:
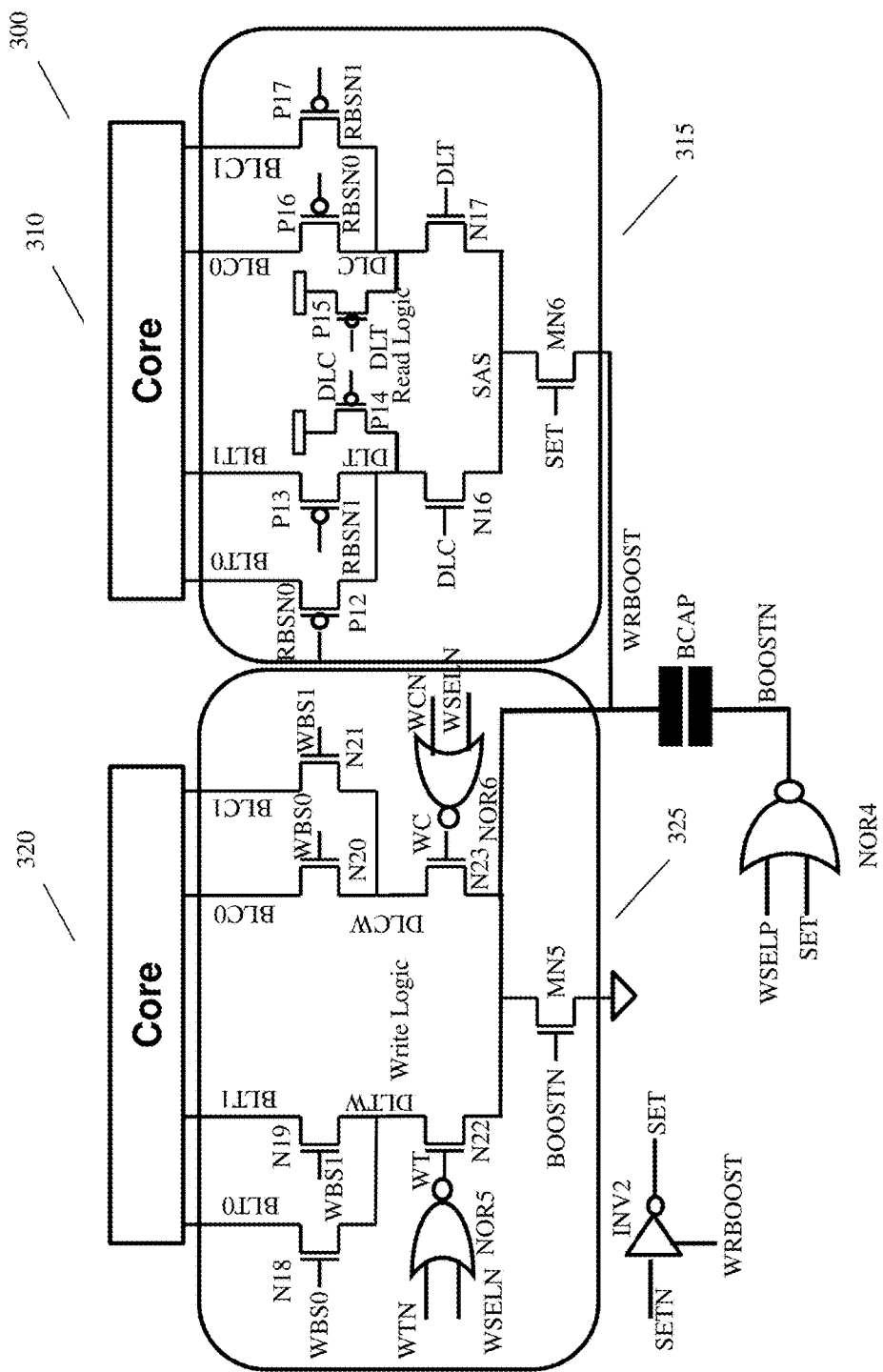
FIG. 3 shows another common boosted assist for write and read operations in accordance with aspects of the present disclosure.

FIG. 3 shows another common boosted assist for write and read operations in accordance with aspects of the present disclosure. Except for the addition of the NOR gates NOR5 and NOR6 in FIG. 3, the common boosted assist circuitry 300 in FIG. 3 is similar to the common boosted assist circuitry 100 in FIG. 1. The addition of the NOR gates NOR5 and NOR6 in the common boosted assist circuitry 300 will prevent either of the write driver turning on to avoid charge leak from the boost during the read operation and use a multi-bank write selection signal WSELN for a multi-bank design. In other words, the NOR gates NOR5 and NOR6 in the write logic 325 will force the first write driver WT and the second writer driver WC to be at a low state during the read operation to prevent data propagation through the write logic 325. The first write driver WT and the second driver WC will be at a low state during the read operation in response to the multi-bank write selection signal WSELN being at a high state.

In FIG. 3, the common boosted assist circuitry 300 includes a read logic circuitry 310 and a write logic circuitry 320. The read logic circuitry 310 includes a core connected to a read logic 315 through a first true bitline BLT0, a first complement bitline BLC0, a second true bitline BLT1, and a second complement bitline BLC1. The write logic circuitry 320 also includes a core connected to a write logic 325 through a first true bitline BLT0, a first complement bitline BLC0, a second true bitline BLT1, and a second complement bitline BLC1. In embodiments, the core of the read logic circuitry 310 can be the same core as the core of the write logic circuitry 320.

Referring still to FIG. 3, in the read logic 315, a PMOS transistor P12 has a source connected to the first true bitline BLT0, a gate connected to a first read bitswitch signal RBSN0, and a drain connected to a data true signal DLT. Further, in the read logic 315, a PMOS transistor P13 has a source connected to a second true bitline BLT1, a gate connected to a second read bitswitch signal RBSN1, and a drain connected to the data true signal DLT. In addition, a PMOS transistor P14 has a source connected to an output, a gate connected to a data complement signal DLC, and a drain connected to the data true signal DLT. Further, PMOS transistor P15 has a source connected to the output, a gate connected to the data true signal DLT, and a drain connected to the data complement signal DLC.

Still referring to the read logic 315, a PMOS transistor P16 has a source connected to the first complement bitline BLC0, a gate connected to the first read bitswitch signal RBSN0, and a drain connected to the data complement signal DLC. A PMOS transistor P17 has a source connected to the second complement bitline BLC1, a gate connected to the second read bitswitch signal RBSN1, and a drain connected to the data complement signal DLC. In the read logic 315, a NMOS transistor N16 has a drain connected to the data true signal DLT, a gate connected to the data complement signal DLC, and a source connected to a sense amplifier signal SAS. A NMOS transistor N17 has a drain connected to the data complement signal DLC, a gate connected to the data true signal DLT, and a source connected to the sense amplifier signal SAS. Lastly, in the read logic 315, a NMOS transistor MN6 has a drain connected to the sense amplifier signal SAS, a gate connected to a sense amplifier enable signal SET, and a drain connected to a boost signal WRBOOST.

Still referring to FIG. 3, in the write logic 325, a NMOS transistor N18 has a drain connected to the first true bitline BLT0, a gate connected to a first write bitswitch signal WBS0, and a source connected to a write data true signal DLTW. A NMOS transistor N19 has a drain connected to the second true bitline BLT1, a gate connected to a second write bitswitch signal WBS1, and a source connected to the write data true signal DLTW. In addition, in the write logic 325, a NMOS transistor N20 has a drain connected to the second complement bitline BLC0, a gate connected to the first write bitswitch signal WBS0, and a source connected to the write data complement signal DLCW. A NMOS transistor N21 has a drain connected to the second complement bitline BLC1, a gate connected to the second write bitswitch signal WBS1, and a source connected to the write data complement signal DLCW.

Still referring to the write logic 325, a NMOS transistor N22 has a drain connected to the write data true signal DLTW, a gate connected to a first write driver WT, and a source connected to a boost signal WRBOOST. A NMOS transistor N23 has a drain connected to the write data complement signal DLCW, a gate connected to a second write driver WC, and a source connected to the boost signal WRBOOST. A NOR gate NOR5 takes inputs of a complement first write driver WTN and a multi-bank selection signal WSELN and outputs the first write driver WT. A NOR gate NOR6 takes inputs of a complement second write driver WCN and a multi-bank selection signal WSELN and outputs the second write driver WC. Lastly, in the write logic 325, a NMOS transistor MN5 has a drain connected to the boost signal WRBOOST, a gate connected to the complement boost signal BOOSTN, and a source connected to ground.

In FIG. 3, the common boosted assist circuitry 300 also includes a boosted capacitor BCAP, a NOR gate NOR4, and an inverter INV2. The write selection signal WSELP and the sense amplifier enable signal SET inputs to the NOR gate NOR4 and outputs the complement boost signal BOOSTN. The complement sense amplifier enable signal SETN is input to the inverter INV2 and outputs the sense amplifier enable signal SET.

The read operation of the common boosted assist circuitry 300 in FIG. 3 is similar to FIG. 1. In particular, the write selection signal WSELP is a "0" value for the entire read operation. Further, during the read operation, the sense amplifier enable signal SET starts at a "0" value and then goes to a "1" value once the bitlines develop a sufficient differential. In embodiments, the sense amplifier enable signal SET can be of a narrow pulse width and the complement sense amplifier enable signal SETN is one gate earlier than the sense amplifier enable signal SET. In embodiments, a multi-bank selection signal WSELN is "1" when not performing a write operation. Once the sense amplifier enable signal SET is a "1" value (i.e., is fired), the complement boost signal BOOSTN goes to a "0" value and will boost the boost signal WRBOOST to a negative voltage value. This negative voltage value of the boost signal WRBOOST is transferred to the sense amplifier signal SAS through the NMOS transistor MN6. Further, the NOR gates NOR5 and NOR6 prevent data propagation through the write logic 325 during the read operation.

The write operation of the common boosted assist circuitry 300 in FIG. 3 is similar to FIG. 1. In particular, the sense amplifier enable signal SET is a "0" value for the entire write operation. Further, during the write operation, the write selection signal WSELP starts at a "0" value and then goes to a "1" value once the bitlines are pulled to ground so that the bitlines can be boosted. Once the write selection signal WSELP is a "1" value, the complement boost signal BOOSTN goes to a "0" value and the sense amplifier bias path (i.e., the read logic 315) will be turned off. The complement boost signal BOOSTN going to a "0" value will create a negative voltage value of the boost signal WRBOOST. The negative voltage value of the boost signal WRBOOST is transferred to the bitlines (e.g., BLT0 and BLT1) of the write logic 325.

Figure 4:
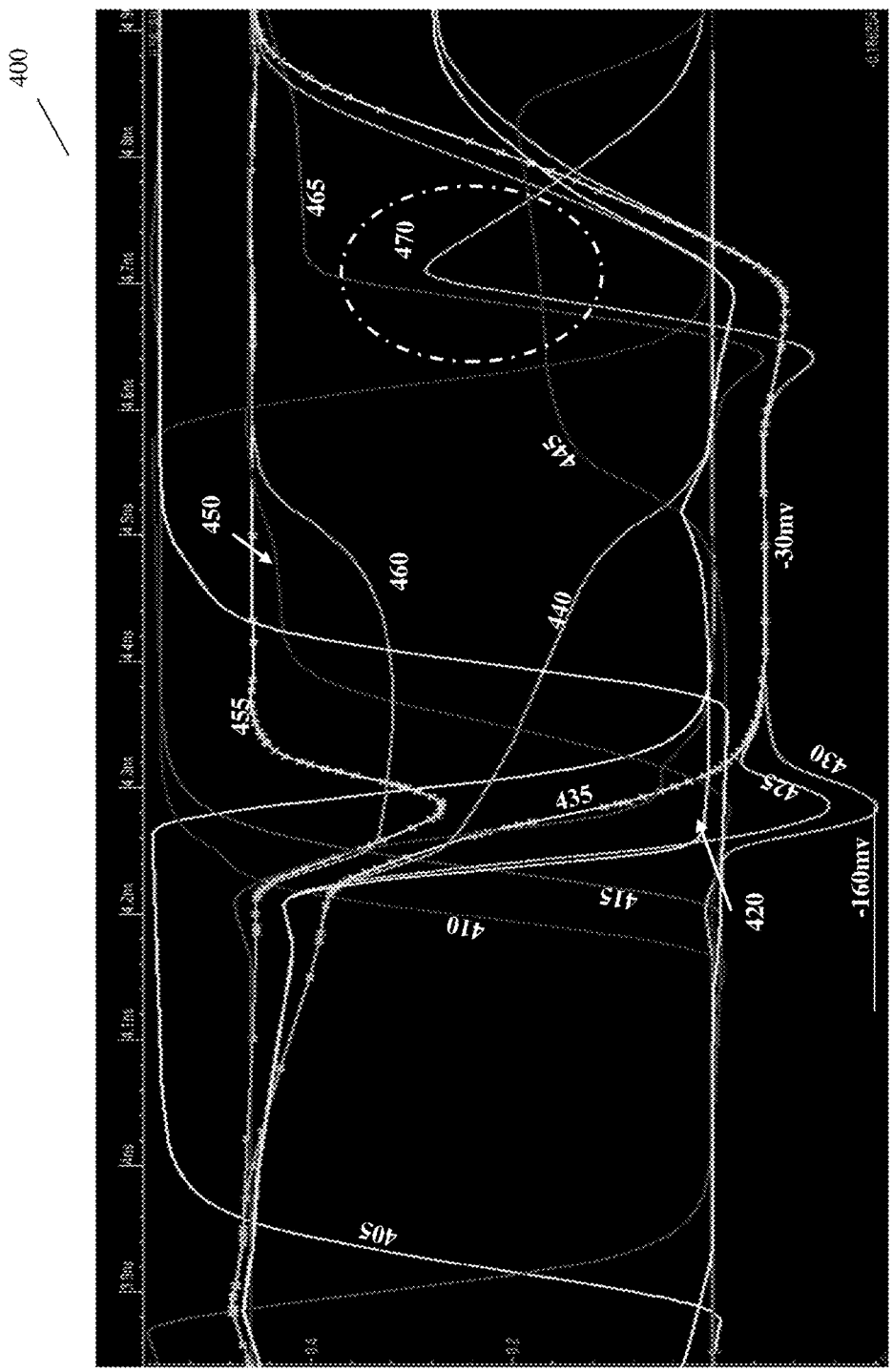
FIG. 4 shows a graph of the common boosted assist for write and read operations in accordance with aspects of the present disclosure.

FIG. 4 shows a graph of the common boosted assist for write and read operations in accordance with aspects of the present disclosure. In FIG. 4, the graph 400 of the common boosted assist circuitry 100, 200, and 300 shows the y-axis in voltage from about −160 mV to about 0.6 V. The x-axis is time shown in nanoseconds from about 3.84 nanoseconds to about 4.92 nanoseconds. The graph 400 includes write waveforms of a known write assist and write waveforms of the common boosted assist circuitry in FIGS. 1-3.

In particular, the graph 400 of FIG. 4 includes a wordline WL 405, a sense amplifier enable signal SET 410, a read bitswitch signal RBSN 415, a sense amplifier signal SAS 425, a boost signal WRBOOST 430, a data line true signal DLT 435. a read global bit line signal RGBLTN 450, a data line complement signal DLC 455, and a complement boost signal BOOSTN 465 of the common boosted assist circuitry 100, 200, and 300. The graph 400 also includes a conventional sense amplifier signal SAS 420, a conventional data line true signal DLT 440, a conventional read global bit line signal RGBLTN 445, and a conventional data line complement signal DLC 460 of a conventional write assist circuitry.

In FIG. 4, the known data line complement signal DLC 460 of a conventional read circuitry struggles to go to a high level. Further, the conventional data line true signal DLT 440 of the conventional read circuitry struggles to go to a low level. In contrast, by using the boost signal WRBOOST 430, the data line complement signal DLC 455 of the common boosted assist circuitry 100, 200, and 300 goes to a high level faster than the conventional data line complement signal DLC 460 in the conventional read circuitry. Further, by using the boost signal WRBOOST 430, the data line true signal DLT 435 of the common boosted assist circuitry goes to a low level faster than the conventional data line true signal DLT 440 of the conventional read circuitry.

Accordingly, when using the common boost assist circuitry 100, 200, and 300, failure yields go down due to an increased boost being used for low voltage values for both read and write operations. Further, when using the common boost assist circuitry 100, 200, and 300, there is no extra logic required for enabling read assist which results in a simpler implementation.

The circuit and the method for a common boosted assist circuitry of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and the method for a common boosted assist circuitry of the present disclosure has been adopted from integrated circuit (IC) technology.

For example, the structures are built on wafers and are realized in films of material patterned by photolithographic processes on the top of a wafer. In particular, the fabrication of the circuit and the method for a write scheme for a common boosted assist circuitry uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising an assist circuit which comprises a read logic circuit and a write logic circuit such that the assist circuit is configured to add a boost voltage using a common boost logic device for both the read logic circuit and the write logic circuit of the assist circuit,
   wherein the write logic circuit comprises a write logic core, a write logic, the common boost logic device, and at least one bitline,
   the read logic circuit comprises a read logic core, a read logic, a sense amplifier, and the at least one bitline, and
   the sense amplifier is directly connected to the added boost voltage through a boost signal such that the sense amplifier is configured to receive the added boost voltage during a read operation.

2. The structure of claim 1, wherein the assist circuit is configured to add the boost voltage to the read logic circuit during the read operation using the common boost logic device.

3. The structure of claim 2, wherein the assist circuit is configured to stop the boost voltage from being added to the write logic circuit during the read operation, using the common boost logic device.

4. The structure of claim 1, wherein the assist circuit is configured to add the boost voltage to the write logic circuit during a write operation, using the common boost logic device.

5. The structure of claim 4, wherein the assist circuit is configured to stop the boost voltage from being added to the read logic circuit during the write operation, using the common boost logic device.

6. The structure of claim 4, wherein the at least one bitline receives the added boost voltage during the write operation.

7. The structure of claim 1, wherein the common boost logic device is at least one NMOS transistor which is configured to control whether the boost voltage is added to the read logic circuit or the write logic circuit.

8. The structure of claim 1, wherein the write logic circuit comprises at least one NOR gate which is configured to avoid charge leak from boost data during the read operation or a write operation.

9. The structure of claim 1, wherein the assist circuit is included in at least one of a static random access memory (SRAM), a dynamic random access memory (DRAM), and a single ended sense amplifier design.

10. A circuit, comprising:
    a read logic circuit which comprises a read logic core, a read logic, a sense amplifier, and at least one bitline and is configured to sense a differential voltage through the sense amplifier during a read operation;
    a write logic circuit which comprises a write logic core, a write logic, a common boost logic device, and the at least one bitline and is configured to write a data value through the at least one bitline during a write operation; and
    the common boost logic device is configured to add a boost voltage to one of the read logic circuit and the write logic circuit,
    wherein the sense amplifier is directly connected to the added boost voltage through a boost signal such that the sense amplifier is configured to receive the added boost voltage during the read operation.

11. The circuit of claim 10, wherein the at least one bitline of the write logic circuit does not receive the added boost voltage during the read operation.

12. The circuit of claim 10, wherein the at least one bitline of the write logic circuit receives the added boost voltage during the write operation.

13. The circuit of claim 12, wherein the sense amplifier of the read logic circuit does not receive the added boost voltage during the write operation.

14. The circuit of claim 10, wherein the common boost logic device is at least one NMOS transistor which is configured to control whether the boost voltage is added to the read logic circuit or the write logic circuit.

15. The circuit of claim 10, wherein the write logic circuit comprises at least one NOR gate which is configured to avoid charge leak from boost data during the read operation or the write operation.

16. The circuit of claim 10, further comprising an assist circuit which includes the read logic circuit and the write logic circuit, and the assist circuit is included in at least one of a static random access memory (SRAM), a dynamic random access memory (DRAM), and a single ended sense amplifier design.

17. A method, comprising:
    adding a boost voltage to a read logic circuit of an assist circuit using a common boost logic device during a read operation;
    adding the boost voltage to a write logic circuit of the assist circuit using the common boost logic device during a write operation; and
    preventing data from being propagated through the write logic circuit during the read operation, wherein the write logic circuit comprises a write logic core, a write logic, the common boost logic device, and at least one bitline, the read logic circuit comprises a read logic core, a read logic, a sense amplifier, and the at least one bitline, and the sense amplifier is directly connected to the added boost voltage through a boost signal such that the sense amplifier is configured to receive the added boost voltage during a read operation.

18. The method of claim 17, wherein the common boost logic device is at least one NMOS transistor and a charge leak is avoided from boost data during the read operation or the write operation using at least one NOR gate.

19. The structure of claim 1, further comprising a NOR gate in the assist circuit which receives a write selection signal and a sense amplifier enable signal and outputs a complement boost signal to a boosted capacitor of the assist circuit.

20. The structure of claim 19, wherein the boosted capacitor is connected between the complement boost signal and the boost signal, the boost signal is directly connected to the write logic circuit through a first NMOS transistor and is directly connected to the read logic circuit through a second NMOS transistor, the first NMOS transistor is gated by the complement boost signal and has a source connected to ground, and the second NMOS transistor is gated by the sense amplifier enable signal and has a source connected to the boost signal.

* * * * *